(12) United States Patent
Liu et al.

(10) Patent No.: US 8,058,705 B2
(45) Date of Patent: Nov. 15, 2011

(54) COMPOSITE MATERIAL SUBSTRATE

(75) Inventors: Po-Chun Liu, Taichung County (TW); Wen-Yueh Liu, Taipei (TW); Chih-Ming Lai, Pingtung County (TW); Yih-Der Guo, Hsinchu (TW); Jenq-Dar Tsay, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/551,534

(22) Filed: Aug. 31, 2009

(65) Prior Publication Data

US 2010/0013054 A1  Jan. 21, 2010

Related U.S. Application Data

(62) Division of application No. 11/467,167, filed on Aug. 25, 2006, now Pat. No. 7,687,378.

(30) Foreign Application Priority Data

Jun. 7, 2006  (TW) .............................. 95120186 A

(51) Int. Cl.
*H01L 21/20* (2006.01)
(52) U.S. Cl. .................................. 257/615; 257/E29.09
(58) Field of Classification Search .................. 428/698, 428/455, 459, 479, 483, 492; 257/615, 623, 257/E21.122, E21.125, E21.133, E29.09
See application file for complete search history.

(56) References Cited

U.S. PATENT DOCUMENTS

| | | | | |
|---|---|---|---|---|
| 5,654,226 A * | 8/1997 | Temple et al. | | 438/458 |
| 6,051,849 A * | 4/2000 | Davis et al. | | 257/103 |
| 6,447,938 B1 * | 9/2002 | Bianchi | | 428/698 |
| 6,468,347 B1 * | 10/2002 | Motoki et al. | | 117/89 |
| 6,478,871 B1 * | 11/2002 | Shealy et al. | | 117/84 |
| 6,861,729 B2 * | 3/2005 | Kozaki et al. | | 257/623 |
| 6,964,914 B2 * | 11/2005 | Ghyselen et al. | | 438/458 |
| 6,979,584 B2 * | 12/2005 | Koike et al. | | 438/44 |
| 7,294,200 B2 * | 11/2007 | Fujikura et al. | | 117/86 |
| 7,338,828 B2 * | 3/2008 | Imer et al. | | 438/46 |
| 7,361,576 B2 * | 4/2008 | Imer et al. | | 438/479 |
| 7,407,865 B2 * | 8/2008 | Park | | 438/442 |
| 2002/0031851 A1 * | 3/2002 | Linthicum et al. | | 438/22 |
| 2002/0197825 A1 * | 12/2002 | Usui et al. | | 438/459 |
| 2003/0114017 A1 * | 6/2003 | Wong et al. | | 438/778 |
| 2004/0023468 A1 * | 2/2004 | Ghyselen et al. | | 438/455 |
| 2004/0147096 A1 * | 7/2004 | Kitaoka et al. | | 438/483 |
| 2004/0183090 A1 * | 9/2004 | Kitaoka et al. | | 257/103 |
| 2005/0022725 A1 * | 2/2005 | Jurgensen et al. | | 117/104 |
| 2005/0032329 A1 * | 2/2005 | Chen et al. | | 438/455 |
| 2006/0035440 A1 * | 2/2006 | Ghyselen et al. | | 438/458 |
| 2006/0046511 A1 * | 3/2006 | Shibata et al. | | 438/767 |
| 2006/0076559 A1 * | 4/2006 | Faure et al. | | 257/49 |
| 2007/0090384 A1 * | 4/2007 | Wu et al. | | 257/99 |
| 2007/0096147 A1 * | 5/2007 | Oshima | | 257/189 |
| 2007/0184637 A1 * | 8/2007 | Haskell et al. | | 438/481 |
| 2007/0252164 A1 * | 11/2007 | Zhong et al. | | 257/98 |
| 2008/0163814 A1 * | 7/2008 | Kim et al. | | 117/95 |

* cited by examiner

*Primary Examiner* — Mary Wilczewski
*Assistant Examiner* — Toniae Thomas
(74) *Attorney, Agent, or Firm* — Jianq Chyun IP Office

(57) ABSTRACT

A composite material substrate having patterned structure includes a substrate, a first dielectric layer, a second dielectric layer, and a nitride semiconductor material. Herein, the first dielectric layer is stacked on the substrate, the second dielectric layer is stacked on the first dielectric layer, and the nitride semiconductor material is stacked on the second dielectric layer and is characterized by a plurality of patterns thereon.

16 Claims, 5 Drawing Sheets

COMPOSITE MATERIAL SUBSTRATE

CROSS-REFERENCE TO RELATED APPLICATION

This application is a divisional application of and claims priority benefit of an application Ser. No. 11/467,167, filed on Aug. 25, 2006, now pending, which claims the priority benefit of Taiwan application serial no. 95120186, filed Jun. 7, 2006. The entirety of each of the above-mentioned patent applications is hereby incorporated by reference herein and made a part of this specification.

BACKGROUND OF THE INVENTION

1. Field of the Invention

The invention relates to a composite material substrate. More particularly, the invention relates to a composite material substrate having patterned structure.

2. Description of Related Art

In recent years, GaN and related ternary compound semiconductors are widely applied to short wavelength optoelectronic devices and high-power high-frequency devices, however, due to the difficulties in fabricating GaN substrate, such semiconductors are generally grown on sapphire substrate and SiC substrate. Even though GaN monocrystal can be successfully grown on these two substrates through heteroepitaxy technology, high density defects are usually produced during epitaxy process due to large lattice mismatch, and such defects will limit the application and development of GaN material in optoelectronic semiconductor devices.

In General, due to the limitation in solubility and diffusibility of nitrogen in liquid gallium, it is very difficult to fabricate GaN substrate by using conventional single crystal growth technology. Thus, in recent years, hydride vapor phase epitaxy (HVPE) is developed and used for increasing the thickness of GaN on sapphire substrate greatly, so as to grow GaN thick film, however, the defect density and macro-cracking can not be reduced effectively, and the main factor thereof is still caused by the differences between lattice constants and coefficients of thermal expansion (CTE) existing in hetero-materials.

Presently, some patents for fabricating low defect density GaN substrate have been issued already, such as U.S. Pat. No. 6,964,914. In this patent, first, $H^+$ implantation is performed to GaN or AlN monocrystal base material, and the implantation depth is the thickness of GaN after subsequent transferring. Then, the thin GaN layer is transferred onto other supporting substrate through direct-wafer-bonding or intermediate-wafer-bonding after the implantation process, and the transferred monocrystal layer is referred to as nucleation layer. Next, a thick GaN monocrystal layer is grown through HVPE. Finally, the GaN thick film and the supporting substrate are separated.

However, the foregoing U.S. patent has some disadvantages even though it can be used for fabricating free standing GaN thick film, for example, the bonding temperature up to 800~1000° C., and the separating temperature of nucleation layer is also up to 900~950° C., high temperatures may cause GaN or the supporting substrate to burst due to the difference in CTE. In addition to this, the present cost of GaN substrate is up to US$10,000.

SUMMARY OF THE INVENTION

Accordingly, the invention is directed to a composite material substrate having patterned structure, where the composite material substrate is suitable for growing nitride semiconductor substrate with low defect density.

The invention provides a composite material substrate having patterned structure, which includes a substrate, a first dielectric layer, a second dielectric layer, and a nitride semiconductor material. Herein, the first dielectric layer is stacked on the substrate, the second dielectric layer is stacked on the first dielectric layer, and the nitride semiconductor material is stacked on the second dielectric layer and is characterized by a plurality of patterns thereon.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A~1I are cross-sectional views illustrating the fabricating flow of a nitride semiconductor substrate according to an exemplary embodiment of the invention.

Figure 1A:
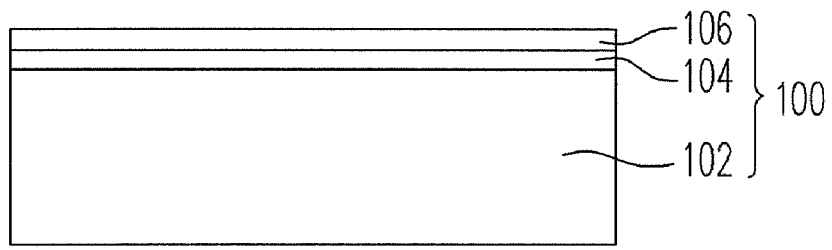
FIGS. 1A~1I are cross-sectional views illustrating the fabricating flow of a nitride semiconductor substrate according to an exemplary embodiment of the invention.

Referring to FIG. 1A, a first substrate 100 is provided, wherein the first substrate 100 includes a first base material 102, a nitride semiconductor template layer 104 stacked on the first base material 102, and a first dielectric layer 106 stacked on the nitride semiconductor template layer 104. Wherein, the material of the nitride semiconductor template layer 104 is, for example, semiconductor material containing one of In, Al, and Ga, such as GaN, AlN, InN, AlGaN, InGaN, or AlInN. The first base material 102 is an epitaxy substrate, such as sapphire, SiC, or Si substrate. The material of the first dielectric layer 106 may be $SiO_2$, $Si_3N_4$, spin on glass (SOG), or other suitable material.

Referring to FIG. 1A again, all the layers shown herein (namely, the nitride semiconductor template layer 104 and the first dielectric layer 106) can be formed by using methods well-known to those having ordinary skill in the art. For example, the formation method of the nitride semiconductor template layer 104 may be metal-organic chemical vapor deposition (MOCVD) or molecular beam epitaxy (MBE).

Figure 1B:
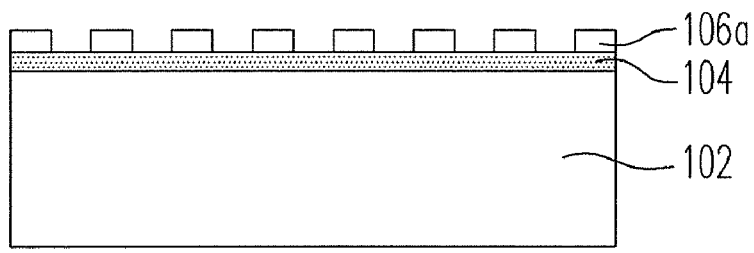

Next, referring to FIG. 1B, the first dielectric layer 106 and the nitride semiconductor template layer 104 in FIG. 1A are patterned, the method used herein includes lithography and etching technologies, and the flow thereof is as shown in FIG. 1B, wherein the first dielectric layer 106 is patterned first so that the patterned first dielectric layer 106a has linear, reticular, or dotted pattern.

Figure 1C:
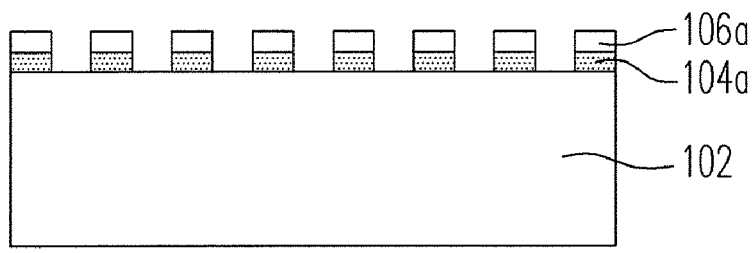

Next, referring to FIG. 1C, the nitride semiconductor template layer 104 is etched using the patterned first dielectric layer 106a as an etching mask. Here, the same pattern as that on the first dielectric layer 106a will be formed on the etched nitride semiconductor template layer 104a. Besides, the patterning process may also be performed to the nitride semiconductor template layer 104 and the first dielectric layer 106 with a photoresist layer (not shown) as the etching mask.

Figure 1D:
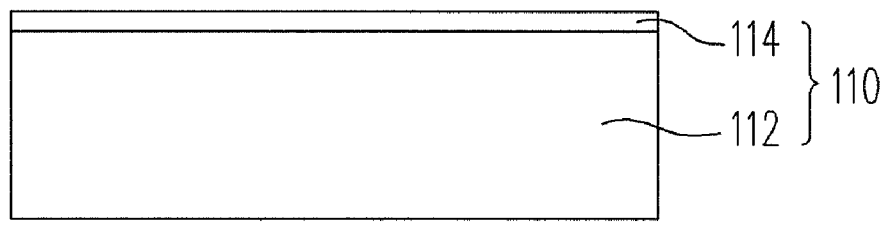

Next, referring to FIG. 1D, a second substrate 110 is provided as the supporting substrate, and the second substrate 110 includes at least a second base material 112 and a second dielectric layer 114 stacked on the second base material 112. Wherein, the second base material 112 is, for example, sapphire, Si, GaP, InP, quartz, high temperature glass, or ceramic substrate. The material of the second dielectric layer 114 is, for example, $SiO_2$, $Si_3N_4$, or SOG. Moreover, if necessary, the second dielectric layer 114 can be further patterned after the second substrate 110 is provided in order to help the immersion of the chemical etching solution in subsequent process.

Figure 1E:
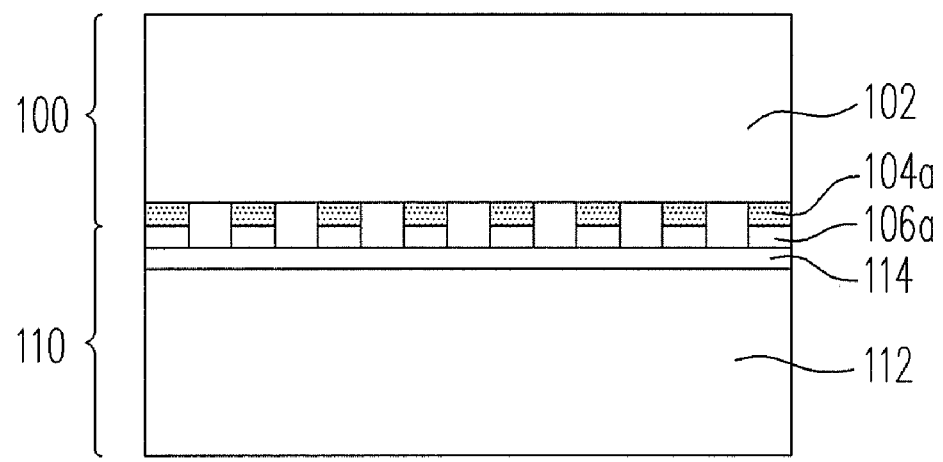

Next, referring to FIG. 1E, the nitride semiconductor template layer 104a and the first dielectric layer 106a of the first substrate 100 are transferred onto the second dielectric layer 114 of the second substrate 110 through bonding and transferring processes. Wherein, the first dielectric layer 106a and the second dielectric layer 114 can be bonded first by using hydrophilic (SC1 =$H_2O$—$NH_4OH$—$H_2O_2$) wafer bonding. Next, the nitride semiconductor template layer 104a is transferred onto the second substrate 110 through mechanical force. For example, the steps of bonding and transferring can be directly completed through the difference between the coefficients of thermal expansion (CTE) of the materials when the materials of the first base material 102 and the second base material 112 are Si or sapphire.

Figure 1F:
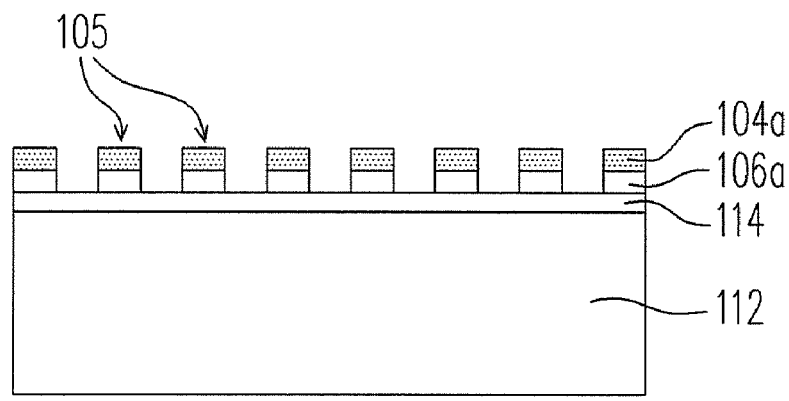

Next, referring to FIG. 1F, after the foregoing bonding and transferring processes, chemical mechanical polishing (CMP) or reactive ion etching is performed to the nitride semiconductor template layer 104a to obtain epi-ready surface 105 and to reduce defect density.

Figure 1G:
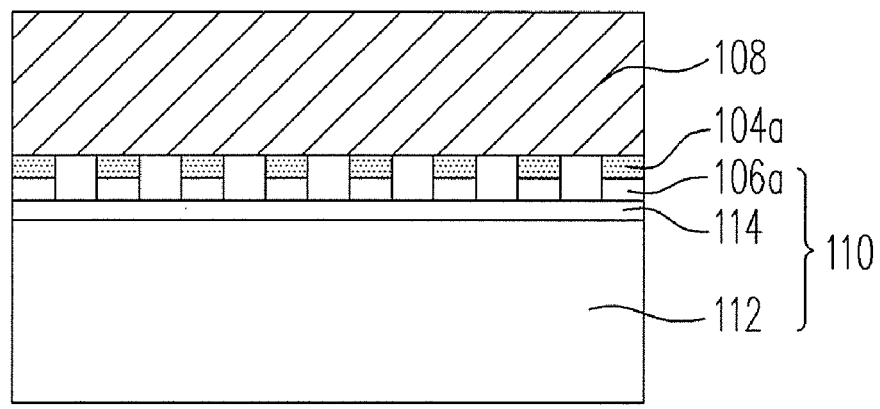

Moreover, referring to FIG. 1G, a nitride semiconductor thick film 108 is grown from the nitride semiconductor template layer 104a through an epitaxy process, wherein the material of the nitride semiconductor thick film 108 includes GaN, AlN, or other material having lattice constant similar to that of the nitride semiconductor template layer 104a. The foregoing epitaxy process is performing GaN monocrystal lateral bonding and thick film growing based on the patterned nitride semiconductor template layer 104a, and the growing method includes epitaxy process, which includes hydride vapor phase epitaxy (HVPE), metal-organic chemical vapor deposition (MOCVD), or molecular beam epitaxy (MBE).

Figures 1, 1H:
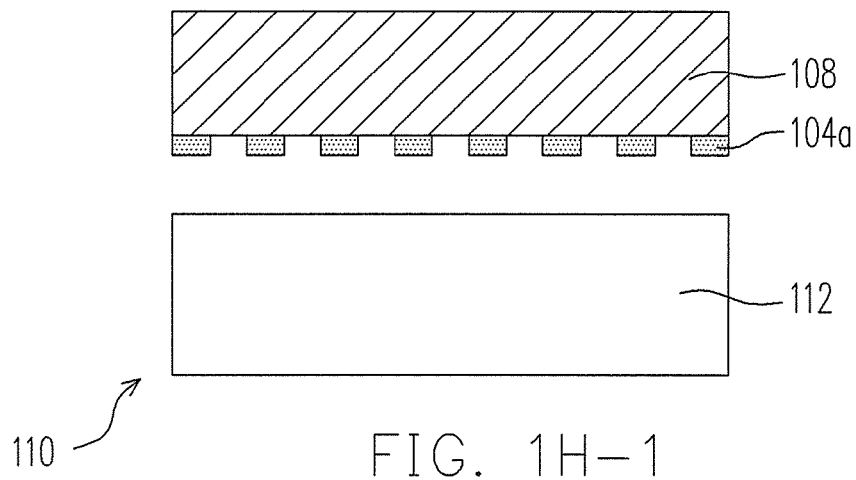
Figures 1, 1H, 2:
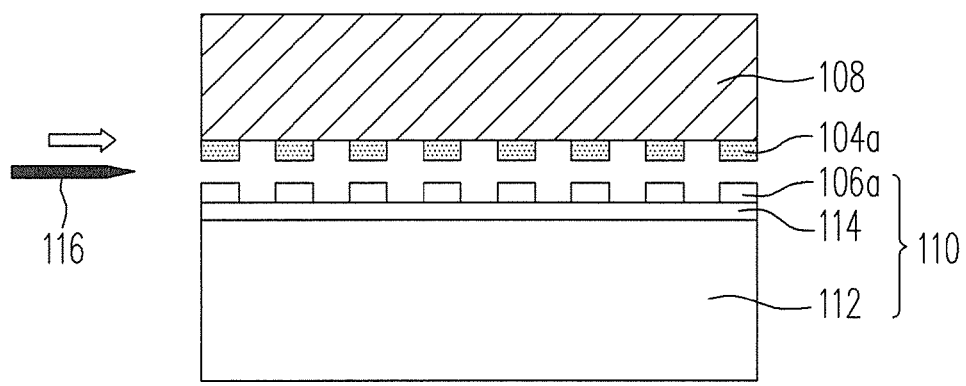
FIG. 2 is a cross-sectional view illustrating the structure of a composite material substrate having patterned structure according to another exemplary embodiment of the invention.

Then refer to FIG. 1H-1 and FIG. 1H-2, which illustrate different methods for separating the nitride semiconductor thick film 108 and the second substrate 110.

In FIG. 1H-1, the bonded first and second dielectric layers 106a and 114 (referring to FIG. 1G) are removed through chemical etching, wherein the chemical etching solution includes hydrofluoric acid (HF) or boffered oxide etch (BOE); for example, BOE=49%, HF:40% $NH_4F$=1:6. Moreover, the immersion of the chemical etching solution is made easier if the second dielectric layer 114 is patterned after the second substrate is provided (as shown in FIG. 1D).

In FIG. 1H-2, the nitride semiconductor thick film 108 and the second substrate 110 are separated through mechanical force, for example, by using a sharp knife 116. Besides, the method for separating the nitride semiconductor thick film 108 and the second substrate 110 may also be alternately applying the chemical etching in FIG. 1H-1 and the mechanical force in FIG. 1H-2 to accelerate the separation. Polishing and chemical etching can be used directly to remove the second base material 112 when the second base material 112 is quartz or high temperature glass.

Figure 1I:
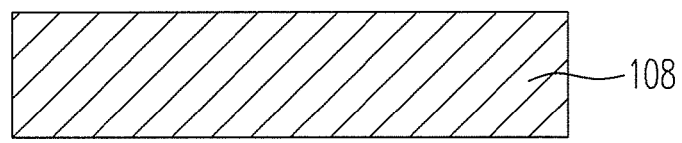
Figure 2:
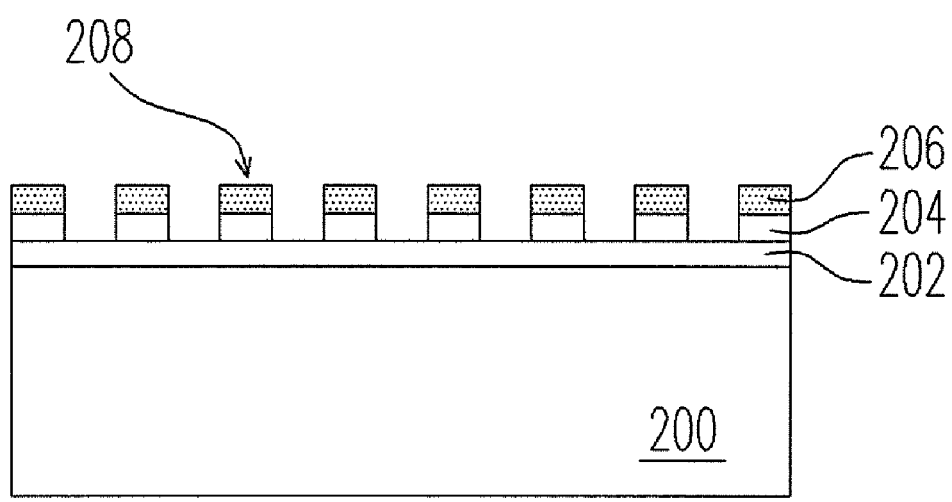

Finally, referring to FIG. 1I, surface polishing process, such as chemical mechanical polishing (CMP), can be performed to the nitride semiconductor thick film 108 obtained through separation.

FIG. 2 is a cross-sectional view illustrating the structure of a composite material substrate having patterned structure according to another exemplary embodiment of the invention, wherein the composite material substrate is suitable for fabricating free standing nitride semiconductor substrate.

Referring to FIG. 2, the composite material substrate in the present embodiment includes a substrate 200, a first dielectric layer 202, a second dielectric layer 204, and a nitride semiconductor material 206, wherein the substrate 200 can be Si, GaP, InP, quartz, glass, or ceramic substrate, for example. The first dielectric layer 202 is stacked on the substrate 200, the second dielectric layer 204 is stacked on the first dielectric layer 202, and the materials of the first dielectric layer 202 and the second dielectric layer 204 respectively include $SiO_2$, $Si_3N_4$, spin on glass (SOG) or other suitable materials. The nitride semiconductor material 206 is stacked on the second dielectric layer 204, wherein the material of the nitride semiconductor material 206 includes semiconductor materials containing one of In, Al, and Ga, such as GaN, AlN, InN, AlGaN, InGaN, or AlInN. Moreover, the nitride semiconductor material 206 has a plurality of patterns 208 on its surface, and the pattern 208 is, for example, linear, reticular, dotted, or other suitable pattern.

In overview, the advantage of the invention is that a patterned nitride semiconductor template layer is used as monocrystal seed layer, so that defect density at subsequent epitaxy growing can be reduced greatly. Moreover, the foregoing nitride semiconductor template layer is transferred onto a hetero-substrate through wafer bonding. Furthermore, nitride semiconductor substrate of low defect density can be obtained through mechanical force self-separation or chemical etching separation after the epitaxy process, thus, the technology provided by the invention is simpler and has lower cost compared to existing technologies.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A composite material substrate having patterned structure, comprising:
    a substrate;
    a first dielectric layer, stacked on the surface of the substrate;
    a second dielectric layer, stacked on the surface of the first dielectric layer;
    a patterned nitride semiconductor layer, stacked on the upper surface of the second dielectric layer, wherein the patterned nitride semiconductor layer does not contact with a plurality of sidewalls of the second dielectric layer.

2. The composite material substrate as claimed in claim 1, wherein the patterned nitride semiconductor layer comprises linear patterns, reticular patterns, or dotted patterns.

3. The composite material substrate as claimed in claim 1, wherein the substrate comprises sapphire, Si, GaP, InP, quartz, glass, or ceramic substrate.

4. The composite material substrate as claimed in claim 1, wherein the materials of the first dielectric layer and the second dielectric layer respectively comprise $SiO_2$, $Si_3N_4$, or spin on glass.

5. The composite material substrate as claimed in claim 1, wherein the material of the patterned nitride semiconductor layer comprises GaN, AlN, InN, AlGaN, InGaN, or AlInN.

6. The composite material substrate as claimed in claim 1, the composite material substrate being suitable for fabricating free standing nitride semiconductor substrate.

7. The composite material substrate as claimed in claim 1, wherein the patterned nitride semiconductor layer is patterned by lithography and etching technologies.

8. The composite material substrate as claimed in claim 1, wherein the second dielectric layer is a patterned layer.

9. A composite material substrate having patterned structure, comprising:
   a substrate;
   a first dielectric layer, directly contacted with the surface of the substrate;
   a second dielectric layer, stacked on the first dielectric layer;
   a plurality of nitride semiconductor patterns, stacked on the upper surface of the second dielectric layer, wherein the plurality of nitride semiconductor patterns do not contact with a plurality of sidewalls of the second dielectric layer.

10. The composite material substrate as claimed in claim 9, wherein the nitride semiconductor patterns comprise linear patterns, reticular patterns, or dotted patterns.

11. The composite material substrate as claimed in claim 9, wherein the substrate comprises sapphire, Si, GaP, InP, quartz, glass, or ceramic substrate.

12. The composite material substrate as claimed in claim 9, wherein the materials of the first dielectric layer and the second dielectric layer respectively comprise $SiO_2$, $Si_3N_4$, or spin on glass.

13. The composite material substrate as claimed in claim 9, wherein the material of the nitride semiconductor patterns comprises GaN, AlN, InN, AlGaN, InGaN, or AlInN.

14. The composite material substrate as claimed in claim 9, the composite material substrate being suitable for fabricating free standing nitride semiconductor substrate.

15. The composite material substrate as claimed in claim 9, wherein the nitride semiconductor patterns are formed by lithography and etching technologies.

16. The composite material substrate as claimed in claim 9, wherein the second dielectric layer is a patterned layer.

* * * * *